(12) United States Patent
Naka (10) Patent No.: US 9,621,150 B2
(45) Date of Patent: Apr. 11, 2017

(54) SEMICONDUCTOR DEVICE WITH DRIVER FOR SWITCHING ELEMENT

(71) Applicant: Kabushiki Kaisha Toshiba, Minato-ku, Tokyo (JP)

(72) Inventor: Toshiyuki Naka, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/839,216

(22) Filed: Aug. 28, 2015

(65) Prior Publication Data

US 2016/0269024 A1 Sep. 15, 2016

(30) Foreign Application Priority Data

Mar. 9, 2015 (JP) .................................. 2015-045975

(51) Int. Cl.
| | |
|---|---|
| *H03K 17/06* | (2006.01) |
| *H02M 3/155* | (2006.01) |
| *H01L 29/20* | (2006.01) |
| *H01L 29/778* | (2006.01) |
| *H03K 17/687* | (2006.01) |

(52) U.S. Cl.
CPC .......... *H03K 17/063* (2013.01); *H02M 3/155* (2013.01); *H01L 29/2003* (2013.01); *H01L 29/7786* (2013.01); *H03K 2017/6875* (2013.01)

(58) Field of Classification Search
CPC ...... H03K 17/10; H03K 17/102; H03K 17/16; H03K 17/30; H03K 17/6871; H03K 19/003; H03K 19/00301; H03K 19/00315
USPC .......................... 327/108, 109, 110, 111, 112
See application file for complete search history.

(56) References Cited

U.S. PATENT DOCUMENTS

2010/0301825 A1* 12/2010 Yamaguchi ......... H02M 3/1588
323/284
2011/0221480 A1* 9/2011 Ikeda ............... H03K 17/04123
327/109

FOREIGN PATENT DOCUMENTS

JP 2010-279132 A 12/2010

* cited by examiner

*Primary Examiner* — John Poos
(74) *Attorney, Agent, or Firm* — White & Case LLP (57) ABSTRACT

According to one embodiment, a semiconductor device includes: a first switching element comprising a heterojunction comprising a first compound semiconductor layer and a second compound semiconductor layer; and a driver which applies a voltage to a gate of the first switching element to control turn-on and turn-off of the first switching element. The driver temporarily increases a gate voltage of the first switching element at a timing when the first switching element is turned on, during a period while the first switching element is on.

18 Claims, 11 Drawing Sheets

SEMICONDUCTOR DEVICE WITH DRIVER FOR SWITCHING ELEMENT

CROSS-REFERENCE TO RELATED APPLICATIONS

This application is based upon and claims the benefit of priority from Japanese Patent Application No. 2015-045975, filed Mar. 9, 2015, the entire contents of which are incorporated herein by reference.

FIELD

Embodiments described herein relate generally to a semiconductor device, and in particular, to a semiconductor device using a compound semiconductor.

BACKGROUND

Electronic devices using nitride semiconductors are utilized as high-speed electronic devices and power devices. Light emitting diodes (LEDs) that are semiconductor light emitting elements using nitride semiconductors are utilized for display apparatuses, lighting, and the like.

Power devices need to have a high withstand voltage and low on-resistance. There is a tradeoff relationship determined by an element material, between the withstand voltage and the on-resistance. When a wide-bandgap semiconductor such as a nitride semiconductor or silicon carbide (SiC) is used as an element material, the tradeoff relationship determined by the material can be improved and increased withstand voltage and reduced on-resistance can be achieved compared to when silicon is used as an element material. Furthermore, elements using a nitride semiconductor such as GaN or AlGaN have excellent material properties and thus allow high performance power devices to be implemented.

DETAILED DESCRIPTION

In general, according to one embodiment, there is provided a semiconductor device comprising:

a first switching element comprising a heterojunction comprising a first compound semiconductor layer and a second compound semiconductor layer; and a driver which applies a voltage to a gate of the first switching element to control turn-on and turn-off of the first switching element, wherein the driver temporarily increases a gate voltage of the first switching element at a timing when the first switching element is turned on, during a period while the first switching element is on.

Embodiments will be described below with reference to the drawings. However, the drawings are schematic or conceptual, and dimensions, ratios, and the like in the drawings are not necessarily the same as the actual dimensions, ratios, and the like. Embodiments disclosed below illustrate an apparatus and a method that embody the technical concepts of the present invention. The technical concepts of the present invention are not limited by the shapes, structures, arrangements, or the like of components. Elements with the same functions and configurations are hereinafter denoted by the same reference numerals, and duplicate descriptions will be given only when needed.

First Embodiment

[1] Configuration of the Semiconductor Device

Figure 1:
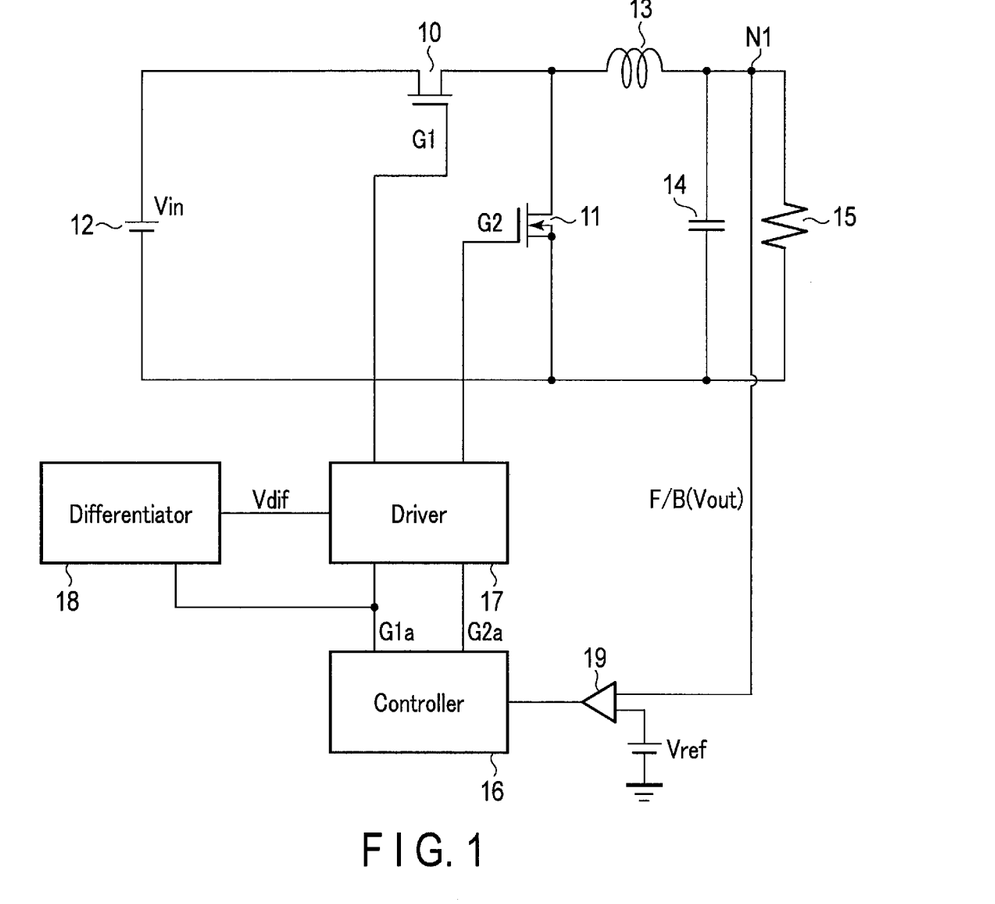
FIG. 1 is a circuit diagram of a semiconductor device according to a first embodiment.

FIG. 1 is a circuit diagram of a semiconductor device 1 according to a first embodiment. The semiconductor device 1 of the present embodiment is a configuration example of a step-down DC-DC converter (also referred to as a buck converter). That is, the semiconductor device 1 is a power supply circuit that converts a DC voltage at a first level into a DC voltage at a second level lower than the first level.

The semiconductor device 1 comprises a normally-on switching element 10, a normally-off switching element 11, a DC power supply 12, an inductor 13, a capacitor 14, a load circuit 15, a controller 16, a driver 17, a differentiator 18, and an error amplifier 19.

The DC power supply 12 outputs a DC voltage Vin (>0). The voltage of a negative electrode of the DC power supply 12 is a negative electrode reference voltage and is, for example, a ground voltage GND (=0 V). The voltage of a positive electrode of the DC power supply 12 is a positive electrode reference voltage and is an input voltage Vin.

The normally-on (depression) switching element 10 is turned off when a negative voltage is applied to a gate of the normally-on switching element 10, and is turned on when 0 V (or higher) is applied to the gate. The normally-on switching element 10 comprises a heterojunction field effect transistor (HFET) or a high electron mobility transistor (HEMT). A drain of the switching element 10 is connected to the positive electrode of the DC power supply 12. The gate of the switching element 10 receives a signal G1 from the driver 17.

The normally-off (enhancement) switching element 11 is turned off when 0 V (or lower) is applied to a gate of the normally-off switching element 11, and is turned on when a positive voltage is applied to the gate. The normally-off switching element 11 comprises, for example, an n-channel MOSFET (Metal Oxide Semiconductor Field Effect Transistor). A drain of the switching element 11 is connected to a source of the switching element 10. A source of the switching element 11 is connected to the negative electrode of the DC power supply 12. The gate of the switching element 10 receives a signal G2 from the driver 17.

The FET as the switching element has a threshold voltage. The FET turns on when a voltage higher than or equal to the threshold voltage is applied to a gate of the FET. The FET turns off when a voltage lower than the threshold voltage is applied to the gate of the FET. In particular, a threshold voltage of the normally-on (depression) switching element is set to a voltage lower than 0 V. a threshold voltage of the normally-off (enhancement) switching element is set to a voltage higher than 0 V.

The inductor 13 and the capacitor 14 provide a smoothing circuit. A first end of the inductor 13 is connected to a source of the switching element 10. A second end of the inductor 13 is connected to a first end of the capacitor 14 via an output node N1. A second end of the capacitor 14 is connected to the negative electrode of the DC power supply 12.

In the semiconductor device 1, the output node N1 outputs an output voltage Vout. The output voltage Vout is used to drive the load circuit 15. The load circuit 15 is connected between the output node N1 and the negative electrode of the DC power supply 12. The load circuit 15 is, for example, electronic equipment such as a computer or a component of the electronic equipment (for example, a CPU or a DSP) and is represented as resistance in the circuit.

The error amplifier 19 receives the output voltage Vout from the output node N1 as a feedback signal (F/B). The error amplifier 19 amplifies a difference between the output voltage Vout and a reference voltage Vref. An output of the error amplifier 19 is input to the controller 16.

The controller 16 controls the switching elements 10 and 11 such that the output voltage Vout is equal (or nearly equal) to the reference voltage Vref. In particular, the controller 16 alternately turns on the switching elements 10 and 11, and controls timings for turning on the switching elements 10 and 11 in order to obtain the output voltage Vout at a desired level (reference voltage Vref). The controller 16 generates a control signal G1a that controls a timing when the switching element 10 is turned on and a control signal G2a that controls a timing when the switching element 11 is turned on.

The differentiator 18 receives the control signal G1a for the switching element 10 from the controller 16. The differentiator 18 generates a voltage Vdif that is a result of differentiation of the control signal G1a.

The driver 17 receives the control signals G1a and G2a from the controller 16 and receives the voltage Vdif from the differentiator 18. The driver 17 adds the voltage Vdif to the control signal G1a to adjust the level of the voltage, thus generating the signal G1 for turning on and off the switching element 10. The driver 17 also adjusts the voltage level of the control signal G2a to generate a signal G2 for turning on and off the switching element 11.

[2] Configuration of the Normally-on Switching Element 10

Figure 2:
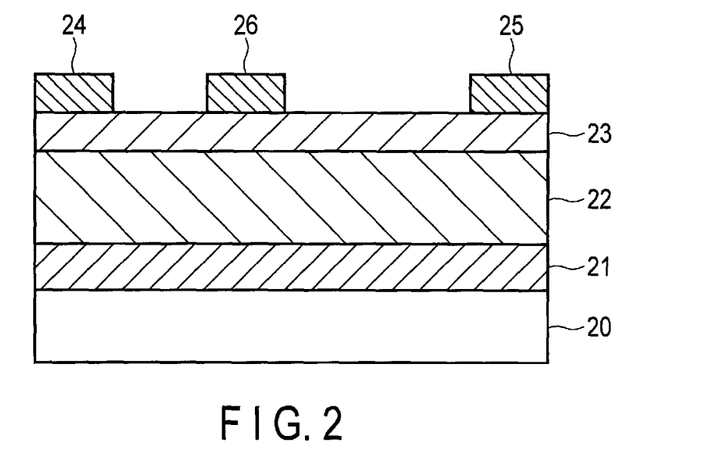
FIG. 2 is a sectional view of a switching element.

Now, a configuration example of the normally-on switching element 10 will be described. FIG. 2 is a sectional view of the switching element 10.

The switching element 10 comprises a buffer layer 21, a channel layer 22, a barrier layer 23, and various electrodes stacked on a substrate 20 in this order.

The substrate 20 is, for example, a silicon (Si) substrate having a (111) face as a principal surface. The substrate 20 may be a sapphire ($Al_2O_3$), silicon carbide (SiC), gallium phosphide (GaP), indium phosphide (InP), gallium arsenide (GaAs), or the like. The substrate 20 may be any single-crystal substrate that allows an epitaxial layer to be grown and is not limited to the above-described materials.

The buffer layer 21 has a function to relieve distortion resulting from a difference between a lattice constant for a nitride semiconductor layer formed on the buffer layer 21 and a lattice constant for the substrate 20 and to control the crystallinity of the nitride semiconductor layer formed on the buffer layer 21. The buffer layer 21 also has a function to suppress chemical reaction between an element (for example, gallium) contained in the nitride semiconductor layer formed on the buffer layer 21 and the element (for example, silicon (Si)) in the substrate 20. The buffer layer 21 is formed of, for example, $Al_XGa_{1-X}N$ ($0 \leq X \leq 1$). In the present embodiment, the buffer layer 21 is formed of AlN.

The channel layer 22 is a layer in which a channel (current path) of the transistor is formed. The channel layer 22 is formed of $In_XAl_YGa_{(1-x-y)}N$ ($0 \leq X < 1$, $0 \leq Y < 1$, $0 \leq X+Y < 1$). The channel layer 22 comprises a nitride semiconductor layer that is an undoped layer and that has high crystallinity (high quality). Undoped means that the layer is not intentionally doped with impurities, and the amount of impurities mixed into the layer during a manufacturing process or the like is included in the term undoped. In the present embodiment, the channel layer 22 is formed of undoped GaN.

The barrier layer 23 forms a heterojunction with the channel layer 22. The barrier layer 23 comprises a nitride semiconductor layer with a bandgap larger than the bandgap in the channel layer 22. The barrier layer 23 is formed of $In_XAl_YGa_{(1-x-y)}N$ ($0 \leq X < 1$, $0 \leq Y < 1$, $0 \leq X+Y < 1$). In the present embodiment, the barrier layer 23 is formed of, for example, undoped AlGaN.

The plurality of semiconductor layers forming the semiconductor device 1 is, for example, sequentially formed by epitaxial growth using an MOCVD (Metal Organic Chemical Vapor Deposition). That is, the plurality of semiconductor layers forming the semiconductor device 1 comprise epitaxial layers.

A source electrode 24 and a drain electrode 25 are provided on the barrier layer 23 so as to be separated from each other. The source electrode 24 and the barrier layer 23 are in ohmic contact with each other. Similarly, the drain electrode 25 and the barrier layer 23 are in ohmic contact with each other. That is, the source electrode 24 and the drain electrode 25 are each formed to contain a material that comes into ohmic contact with the barrier layer 23. As the source electrode 24 and the drain electrode 25, for example, titanium (Ti) or a stack structure of Al/Ti is used. The right side of "/" represents a lower layer, and the left side of "/" represents an upper layer.

A gate electrode 26 is provided on the barrier layer 23 and between the source electrode 24 and the drain electrode 25. The gate electrode 26 and the barrier layer 23 are joined together so as to form a Schottky barrier. That is, the gate electrode 26 is formed to contain a material joined to the barrier layer 23 so as to form a Schottky barrier. As the gate electrode 26, for example, an Au/Ni stack structure is used. For increased withstand voltage (breakdown voltage) between the gate and the drain, the distance between the gate electrode 26 and the drain electrode 25 is set longer than the distance between the gate electrode 26 and the source electrode 24.

The switching element (HFET) 10 depicted in FIG. 2 is a Schottky barrier HFET. The switching element 10 may be an MIS (metal insulator semiconductor) HFET with a gate insulting film interposed between the gate electrode 26 and the barrier layer 23.

In the heterojunction between the channel layer 22 and the barrier layer 23, the barrier layer 23 may be distorted because the barrier layer 23 has a smaller lattice constant than the channel layer 22. Due to a piezo effect resulting from the distortion, piezo polarization occurs in the barrier layer 23 to generate a two-dimensional electron gas (2DEG) near the interface between the channel layer 22 and the barrier layer 23. The two-dimensional electron gas serves as a channel between the source electrode 24 and the drain electrode 25. Then, a Schottky barrier resulting from the junction between the gate electrode 26 and the barrier layer 23 enables a drain current to be controlled. Furthermore, carriers flow through the two-dimensional electron gas at high speed, enabling the switching element 10 to perform vary quick switching operations.

[3] Operation

Figure 3:
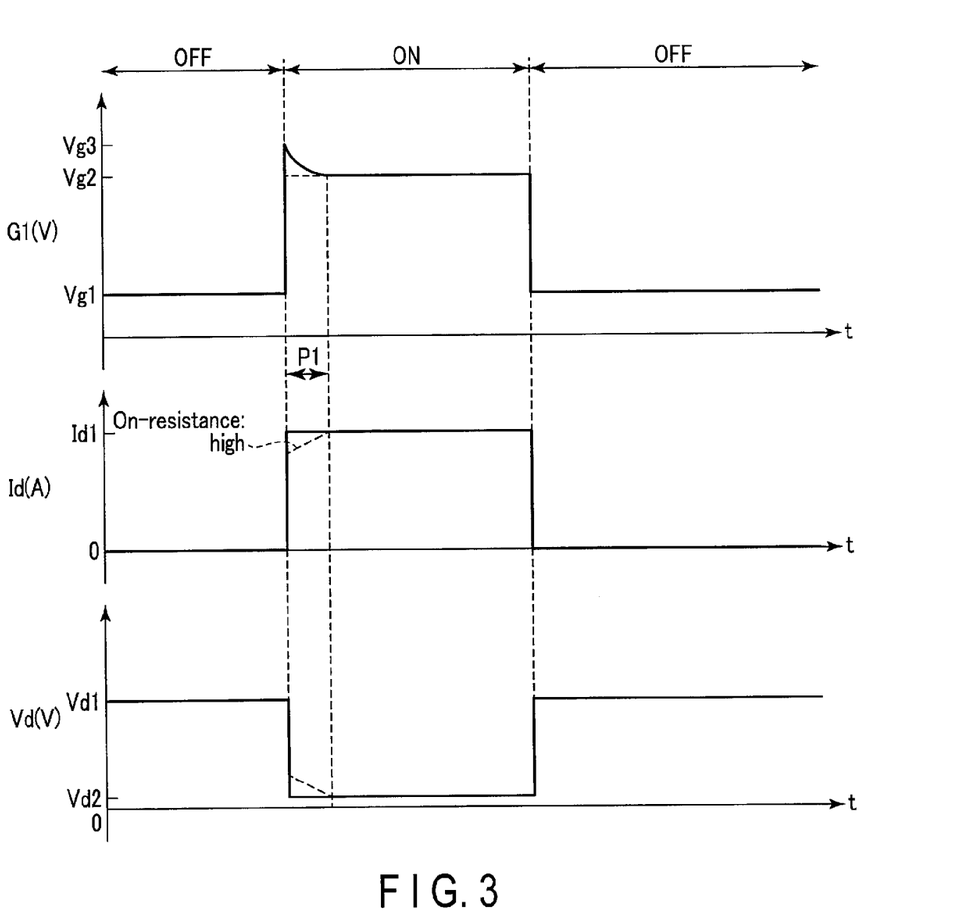
FIG. 3 is a timing chart illustrating operations of a semiconductor device according to a first embodiment.

Now, operations of the semiconductor device 1 configured as described above will be described. FIG. 3 is a timing chart illustrating operations of the semiconductor device 1. FIG. 3 illustrates a signal G1(V) supplied to the gate of the switching element 10, a drain current Id(A) from the switching element 10, and a drain voltage Vd(V) from the switching element 10.

When the switching element 10 is formed of HFET (GaN-HFET) using gallium nitride (GaN), the on-resistance of the switching element 10 may be temporarily kept high for a predetermined period since turn-on of the switching element 10. When the gate voltage of the switching element 10 is kept constant, the drain current decreases and the drain voltage increases during a period of increased on-resistance of the switching element 10. This is indicated by dashed lines on waveforms of the drain current Id and the drain voltage Vd. Consequently, power loss in the semiconductor device 1 increases.

Thus, in the present embodiment, the gate voltage of the switching element 10 is temporarily increased during the period of increased on-resistance of the switching element 10. Consequently, the on-resistance of the switching element 10 is decreased to reduce the power loss in the semiconductor device 1.

As depicted in FIG. 3, based on control of the controller 16, the driver 17 controls the gate voltage of the switching element 10 so as to repeatedly turn on and off the switching element 10. The driver 17 applies a voltage Vg1 to the gate of the switching element 10 as the signal G1 while the switching element 10 is off. The voltage Vg1 is a voltage that enables the switching element 10 to be turned off, and is a negative voltage (for example, −15 V) in the present embodiment.

Subsequently, at a timing when the switching element 10 is turned on, the driver 17 applies a voltage Vg3 to the gate of the switching element 10 as the signal G1. The voltage Vg3 is generated based on the voltage Vdif from the differentiator 18 and the control signal G1a from the controller 16. The voltage Vg3 is set higher than a voltage Vg2. The voltage Vg2 is a voltage that enables the switching element 10 to be turned on, and is, for example, 0 V in the present embodiment. The voltage Vg3 is desirably set such that a drain voltage at a timing when the switching element 10 is turned on (state where the on-resistance of the switching element 10 is temporarily increased) is substantially the same as a drain voltage in a state where the on-resistance of the switching element 10 is stable (approximately constant).

The driver 17 maintains the signal G1 at a voltage higher than the voltage Vg2 during a period P1 when the on-resistance of the switching element 10 is temporarily increased. The period P1 is determined in accordance with an on resistance-related property of the switching element 10. During a period following the period P1, the driver 17 applies the voltage Vg2 to the gate of the switching element 10 as the signal G1. Thus, the switching element 10 holds an on state.

A drain current Id1 obtained while the switching element 10 is on has any value. A drain voltage Vd1 obtained when the switching element 10 is off and a drain voltage Vd2 (<Vd1) obtained when the switching element 10 is on have any values.

As described above, the switching elements 10 and 11 are alternately turned on. Consequently, the driver 17 controls the voltage level of the signal G2 so as to turn on the switching element 11 while the switching element 10 is off. The level of the output voltage Vout can be adjusted by changing the ratio of the on-period of the switching element 10 to the periods of the switching element 10 including the on-period and the off-period (duty ratio).

The semiconductor device 1 is not limited to the configuration in FIG. 1. It is also preferable that the switching element 10 be of the normally off type, whereas the switching element 11 may be of the normally on type. Both the switching elements 10 and 11 may be of the normally on type.

The switching element 11 may comprise an HFET. In this configuration example, the gate voltage of the switching element 11 is temporarily increased during the period of increased on-resistance of the switching element 11 as is the case with the voltage control of the switching element 10.

[4] Effects

As described above in detail, in the first embodiment, the semiconductor device 1 comprises the normally-on switching element 10 comprising the first and second compound semiconductor layers and including the heterojunction, and the driver 17 that applies a voltage to the gate of the switching element 10 to control turn-on and turn-off of the switching element 10. The driver 17 temporarily increases the gate voltage of the switching element 10 at the timing when the switching element 10 is turned on, during the period while the switching element 10 is on.

Therefore, the first embodiment enables a reduction in the power loss in the semiconductor device 1 even when the on-resistance of the switching element 10 is temporarily increased during the period P1 included in the period while the switching element 10 is on and including the timing for turn-on. This allows the efficiency (power conversion efficiency) of the semiconductor device 1 to be improved.

Second Embodiment

In the normally-on switching element 10 formed of, for example, GaN-HFET, the on-resistance of the switching element 10 may be temporarily kept high for a predetermined period since turn-off of the switching element 10. Thus, in a second embodiment, the gate voltage of the switching element 10 is temporarily kept low for a predetermined period since the turn-off of the switching element 10.

Figure 4:
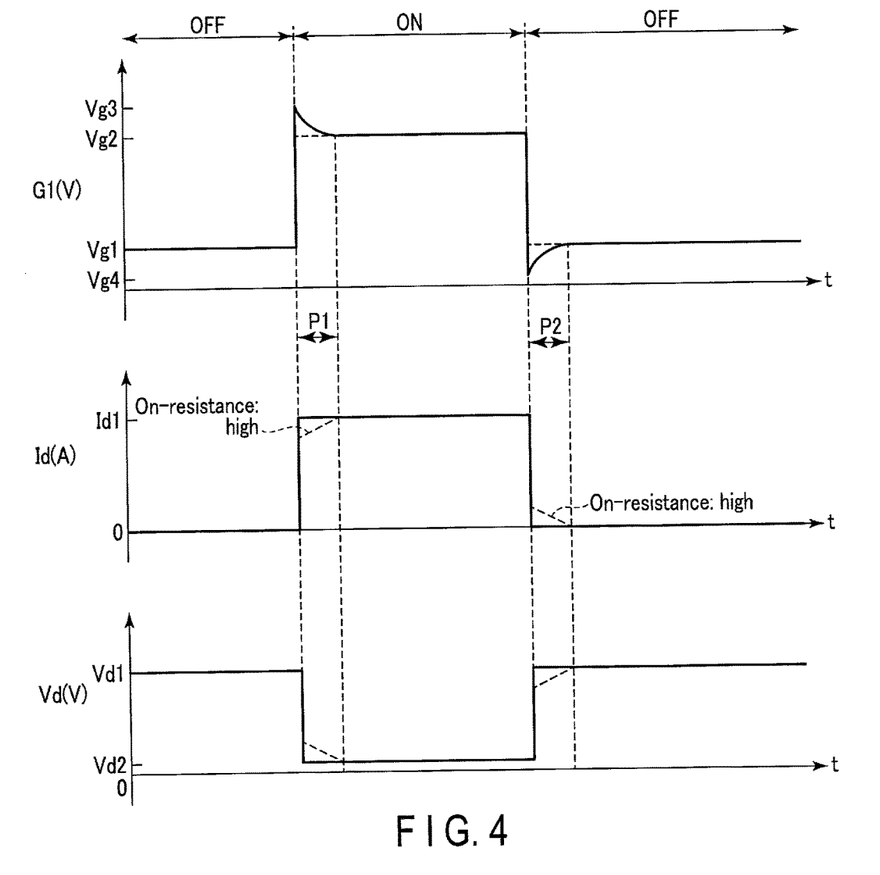
FIG. 4 is a timing chart illustrating operations of a semiconductor device according to a second embodiment.

FIG. 4 is a timing chart illustrating operations of the semiconductor device 1 according to the second embodiment. The circuit configuration of the semiconductor device 1 according to the second embodiment is the same as the circuit configuration in FIG. 1.

The driver 17 applies a voltage Vg4 to the gate of the switching element 10 as the signal G1 at a timing when the switching element 10 is turned off. The voltage Vg4 is generated based on the voltage Vdif from the differentiator 18 and the control signal G1a from the controller 16. The voltage Vg4 is set lower than the voltage Vg1. The voltage Vg4 is desirably set such that a drain voltage at a timing when the switching element 10 is turned off (state where the on-resistance of the switching element 10 is temporarily increased) is substantially the same as a drain voltage in a state where the on-resistance of the switching element 10 is stable (approximately constant).

The driver 17 maintains the signal G1 at a voltage lower than the voltage Vg1 during a period P2 while the on-resistance of the switching element 10 is temporarily increased. The period P2 is determined in accordance with the on resistance-related property of the switching element 10. Subsequently, the driver 17 applies the voltage Vg1 to the gate of the switching element 10 as the signal G1. Thus, the switching element 10 holds an off state.

The switching element 11 may comprise an HFET. In this configuration example, the gate voltage of the switching element 11 is temporarily increased during the period of increased on-resistance of the switching element 11 as is the case with the voltage control of the switching element 10.

As described above in detail, the second embodiment not only produces the effects of the first embodiment but also enables a reduction in power loss during the off state of the switching element 10. In FIG. 4, the gate voltage of the switching element 10 is changed at both timings when the switching element 10 is turned on and off. However, the present invention is not limited to this, and it is also preferable that the gate voltage of the switching element 10 be reduced only at the timing when the switching element 10 is turned off.

Third Embodiment

In a third embodiment, the controller 16 has a function corresponding to the differentiator 18 and generates two types of voltage levels while the normally-on switching element 10 is on.

Figure 5:
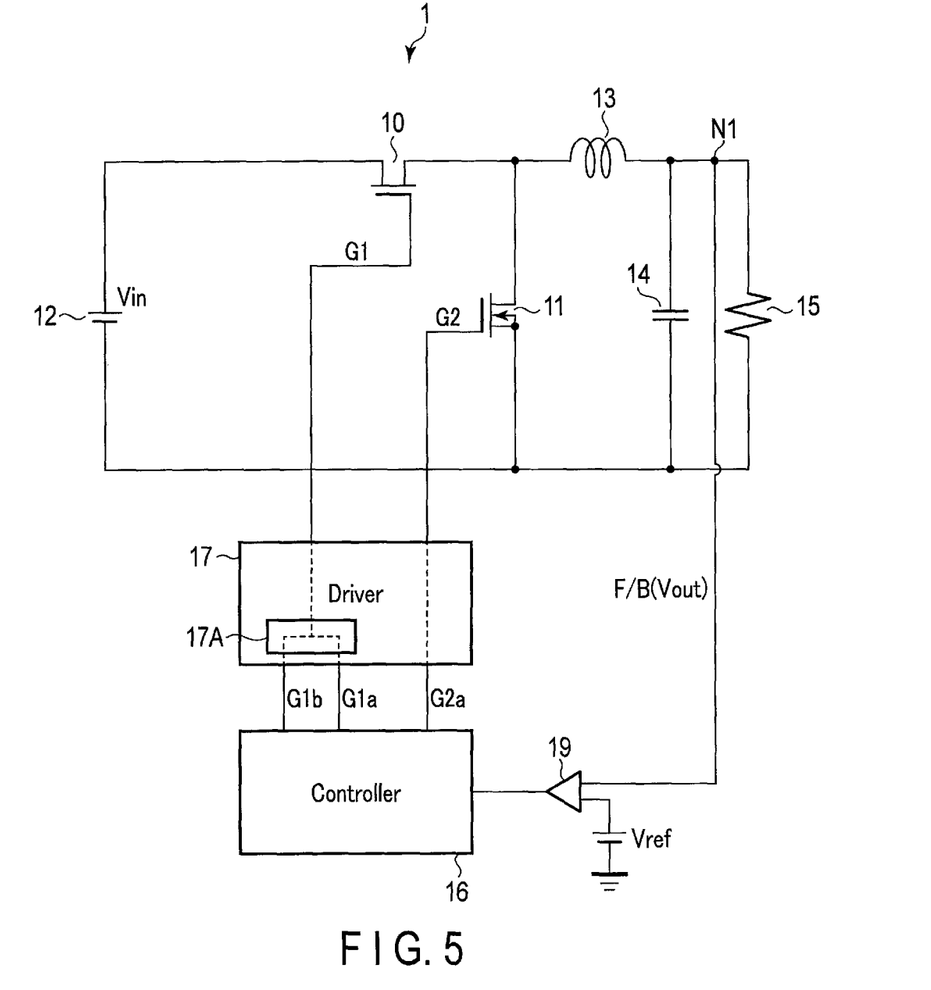
FIG. 5 is a circuit diagram of a semiconductor device according to a third embodiment.
Figure 6:
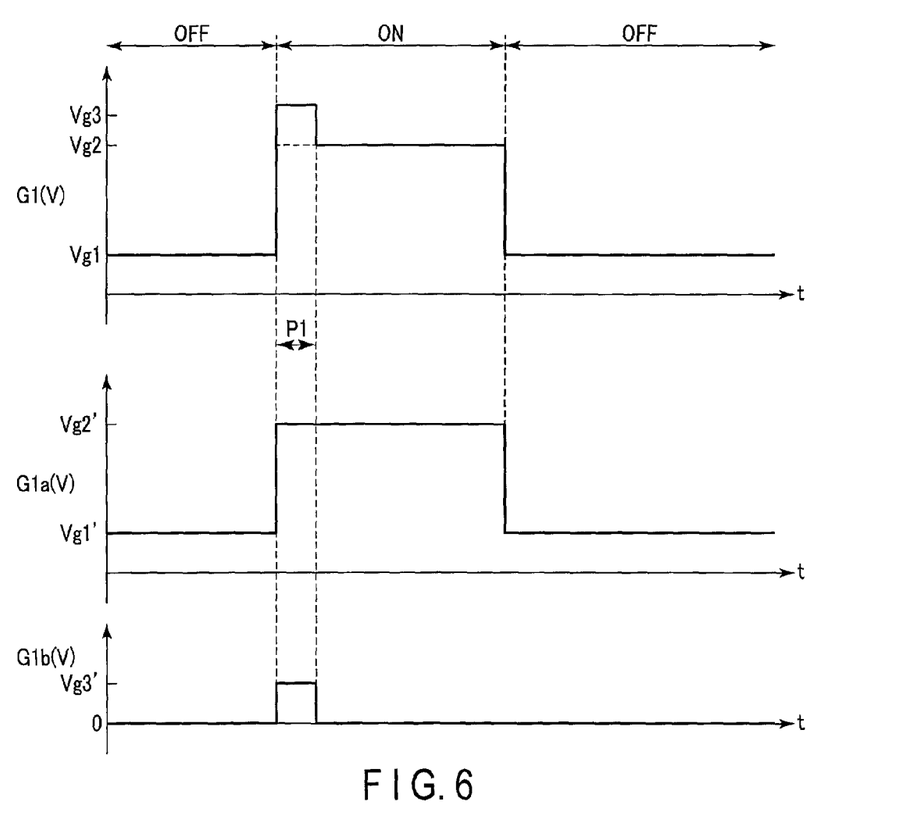
FIG. 6 is a timing chart illustrating control signals from a controller according to the third embodiment.

FIG. 5 is a circuit diagram of the semiconductor device 1 according to the third embodiment. FIG. 6 is a timing chart illustrating control signals from the controller 16 according to the third embodiment.

The controller 16 generates control signals G1a and G1b. The control signal G1a is at a voltage Vg1' while the switching element 10 is off and at a voltage Vg2' (>Vg1') while the switching element 10 is on. The control signal G1b is at a voltage VG3' (>0 V) during the period P1 while the on-resistance of the switching element 10 is temporarily increased, and is at 0 V during the period other than the period P1.

The drive 17 comprises a synthesis circuit 17A that synthesizes the two types of control signals G1a and G1b. Based on the control signals G1a and G1b, the driver 17 generates a signal G1 applied to the gate of the switching element 10. The signal G1 is at the voltage Vg3 during the period P1 while the switching element 10 is on, and is at the voltage Vg2 during the period other than the period P1 while the switching element 10 is on.

Figure 7:
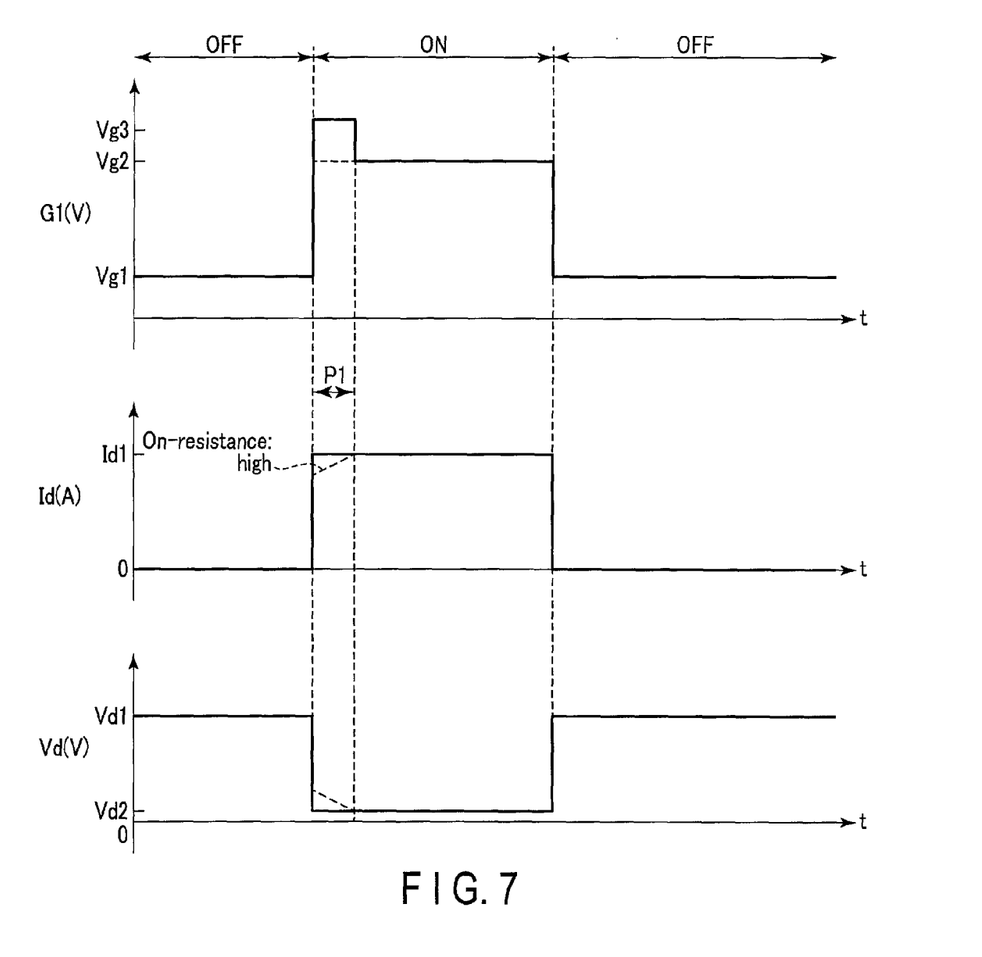
FIG. 7 is a timing chart illustrating operations of the semiconductor device according to the third embodiment.

FIG. 7 is a timing chart illustrating operations of the semiconductor device 1 according to the third embodiment. The driver 17 generates the signal G1 in FIG. 7 to reduce the power loss during the period P1 while the on-resistance of the switching element 10 is temporarily increased. Thus, the third embodiment allows production of the same effects as those of the first embodiment.

(Modification)

As is the case with the second embodiment, the gate voltage of the switching element 10 may be kept low for a predetermined period since the turn-off of the switching element 10.

Figure 8:
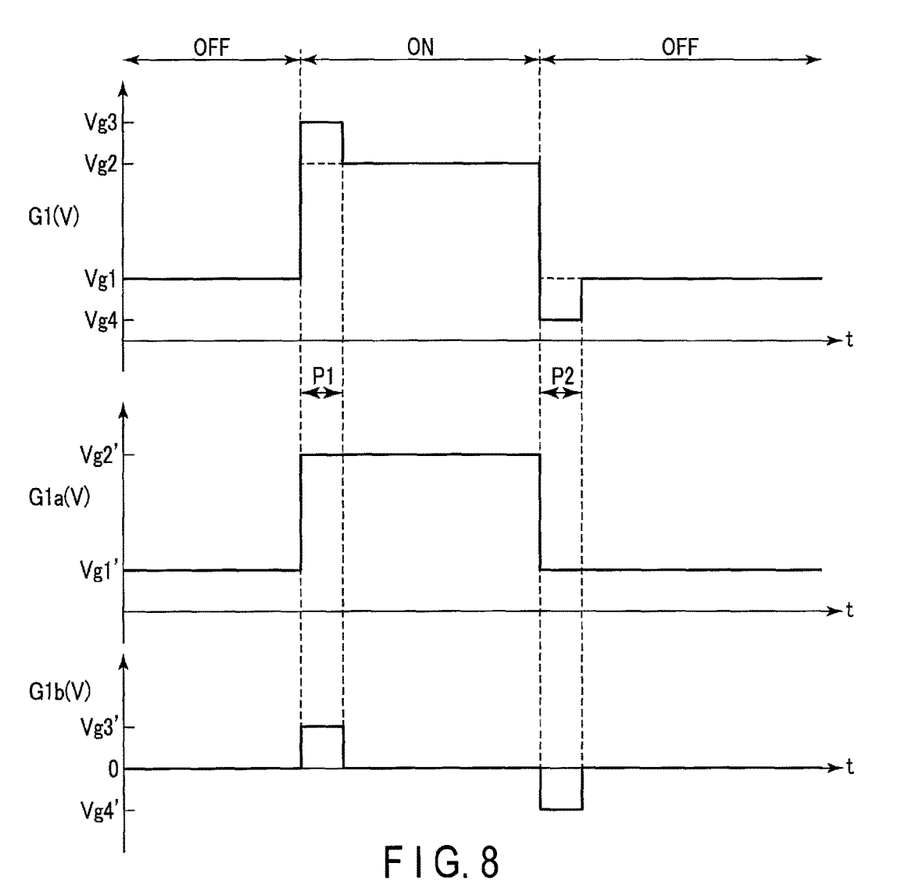
FIG. 8 is a timing chart illustrating control signals from a controller according to a modification.
Figure 9:
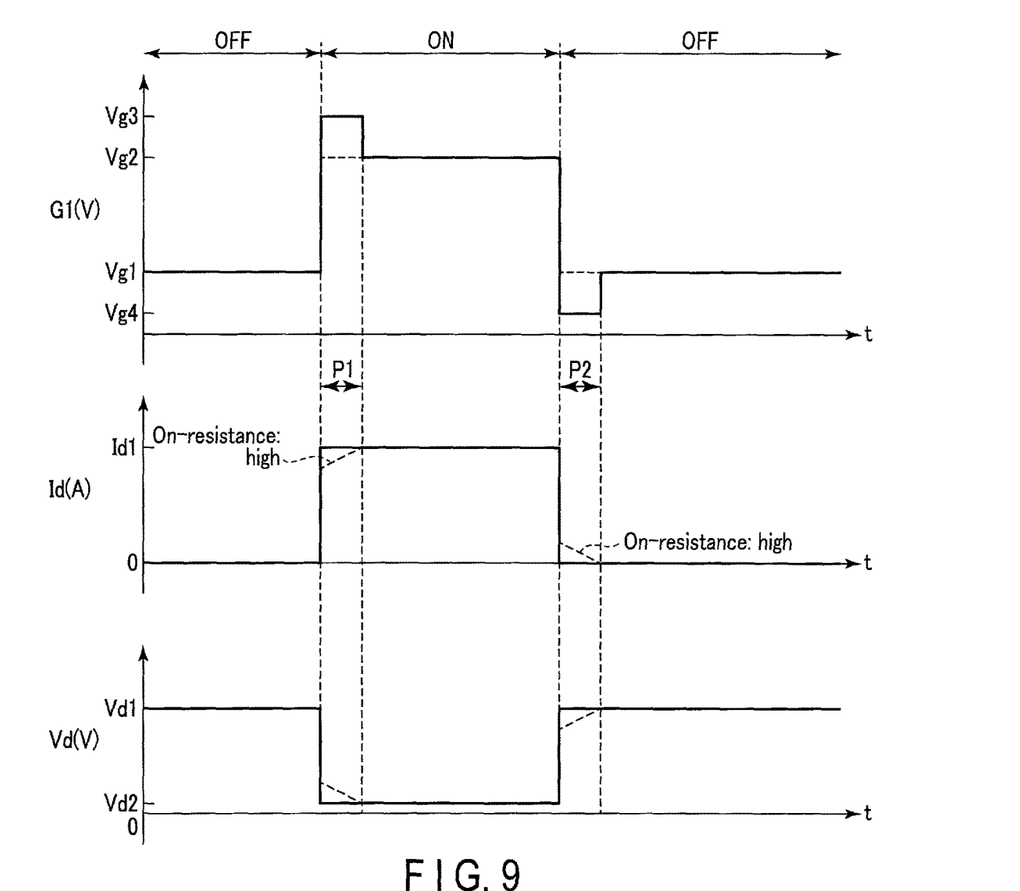
FIG. 9 is a timing chart illustrating operations of a semiconductor device according to the modification.

FIG. 8 is a timing chart illustrating the control signals from the controller 16 according to a modification. FIG. 9 is a timing chart illustrating operations of the semiconductor device 1 according to the modification.

The control signal G1b generated by the controller 16 is at a voltage Vg4' (<0 V) during the period P2 while the on-resistance of the switching element 10 is temporarily increased. The driver 17 generates the signal G1 in FIG. 9 to reduce the power loss during the period P2 while the on-resistance of the switching element 10 is temporarily increased. Thus, the modification allows production of the same effects as those of the second embodiment.

Fourth Embodiment

Figure 10:
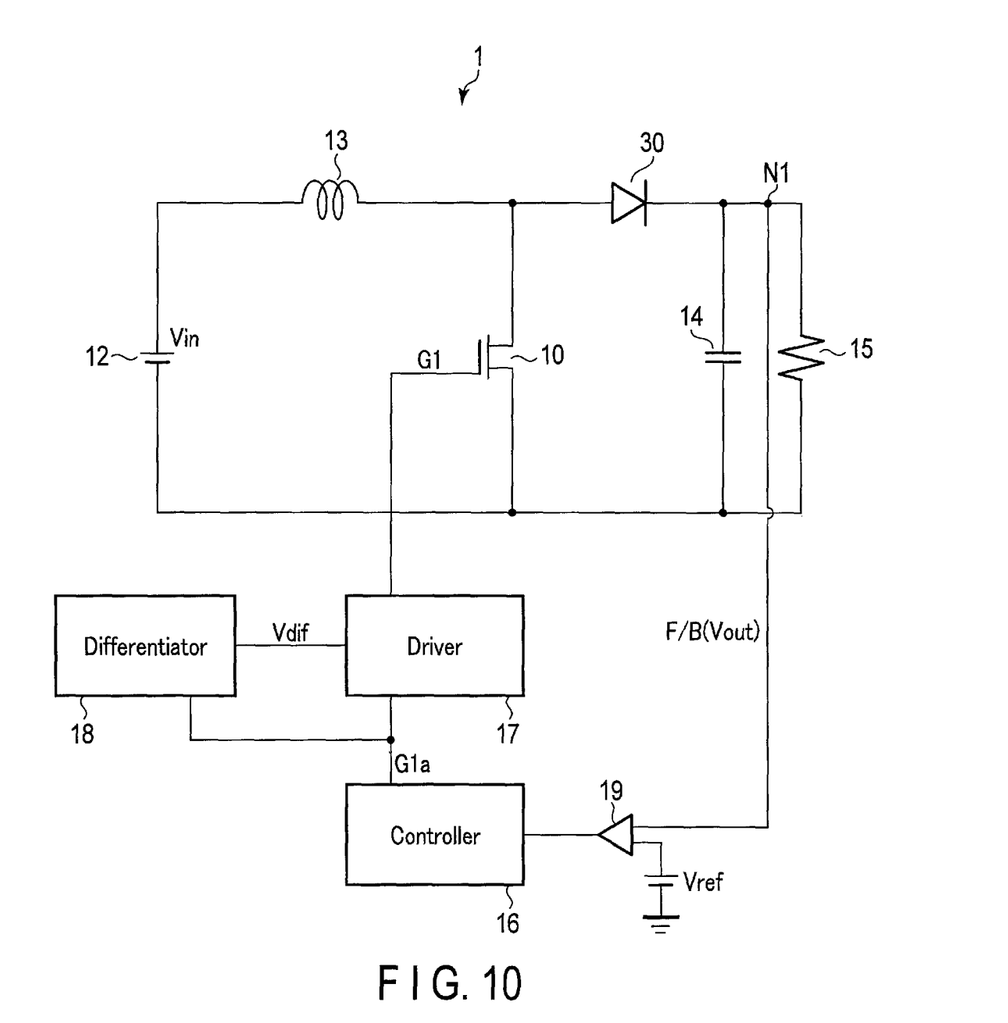
FIG. 10 is a circuit diagram of a semiconductor device according to a fourth embodiment.

The fourth embodiment is an applied example of a step-up DC-DC converter (also referred to as a boost converter). FIG. 10 is a circuit diagram of the semiconductor device 1 according to the fourth embodiment.

The semiconductor device 1 comprises the normally-on switching element 10, the DC power supply 12, the inductor 13, the capacitor 14, a diode 30, the load circuit 15, the controller 16, the driver 17, and the differentiator 18. The configuration of the normally-on switching element 10 is the same as the configuration in the first embodiment.

One end of the inductor 13 is connected to the positive electrode of the DC power supply 12. The second end of the inductor 13 is connected to the drain of the switching element 10 and to an anode of the diode 30. The source of the switching element 10 is connected to the negative electrode of the DC power supply 12. The gate of the switching element 10 receives the signal G1 from the driver 17. A cathode of the diode 30 is connected to the first end of the capacitor 14 via the output node N1. The second end of the capacitor 14 is connected to the negative electrode of the DC power supply 12.

The switching element 10 is controlled so as to be repeatedly turned on and off. Operations of the controller 16, the driver 17, and the differentiator 18 are the same as the operations of the controller 16, the driver 17, and the differentiator 18 in the first embodiment. The duty ratio of the switching element 10 is changed to allow the level of the output voltage Vout to be adjusted. A MOSFET may be used instead of the diode 30. In this case, the two switching elements are alternately turned on.

As described above, the same effects as those of the first embodiment can be produced even when the semiconductor device 1 is configured as a step-up DC-DC converter. Furthermore, the second and third embodiments may be applied to the fourth embodiment.

Fifth Embodiment

Figure 11:
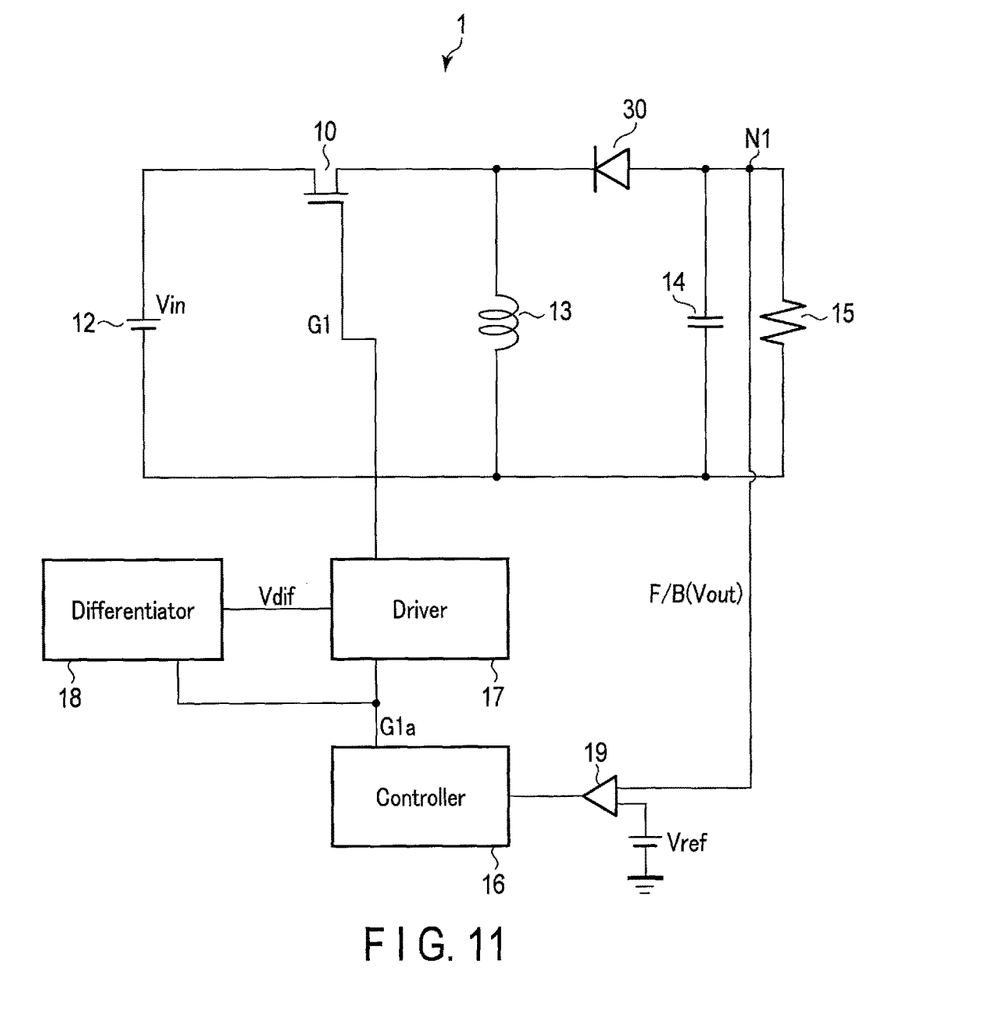
FIG. 11 is a circuit diagram of a semiconductor device according to a fifth embodiment.

A fifth embodiment is an applied example of a step-up and -down DC-DC converter (also referred to as a buck-boost converter). FIG. 11 is a circuit diagram of the semiconductor device 1 according to the fifth embodiment.

The components of the semiconductor device 1 are the same as the components of the fourth embodiment. The drain of the switching element 10 is connected to the positive electrode of the DC power supply 12. The gate of the switching element 10 receives the signal G1 from the driver 17. The source of the switching element 10 is connected to the first end of the inductor 13 and to the cathode of the diode 30.

The second end of the inductor 13 is connected to the negative electrode of the DC power supply 12. The anode of the diode 30 is connected to the first end of the capacitor 14. The second end of the capacitor 14 is connected to the negative electrode of the DC power supply 12.

The switching element 10 is controlled so as to be repeatedly turned on and off. Operations of the controller 16, the driver 17, and the differentiator 18 are the same as the operations of the controller 16, the driver 17, and the differentiator 18 in the first embodiment. The duty ratio of the switching element 10 is changed to allow the level of the output voltage Vout to be adjusted. A MOSFET may be used instead of the diode 30. In this case, the two switching elements are alternately turned on.

As described above, the same effects as those of the first embodiment can be produced even when the semiconductor device 1 is configured as a step-up and -down DC-DC converter. Furthermore, the second and third embodiments may be applied to the fifth embodiment.

In the above-described embodiments, the HFET (HEMT) is used as the switching element. However, the switching element is not limited to the HFET, and the above-described embodiments may be applied to switching elements characterized in that the on-resistance of the element is temporarily increased at the time of turn-on and/or turn-off.

In the first to fifth embodiments, the semiconductor device is illustrated as the step-down DC-DC converter, the step-up DC-DC converter, and the step-up and -down DC-DC converter. However, the embodiments may also be applied to any other power supply circuit utilizing a switching element.

In the present embodiment, the semiconductor device is configured using the nitride semiconductor. However, the present invention is not limited to this, and the present embodiment may be applied to any compound semiconductor other than the nitride semiconductor.

The "nitride semiconductor" as used herein includes semiconductors of all compositions resulting from variation of composition ratios of x and y in $In_xAl_yGa_{(1-x-y)}N$ ($0 \le x \le 1$, $0 \le y \le 1$, $0 \le x+y \le 1$) within the respective ranges. In connection with this chemical formula, the "nitride semiconductors" includes those which further contain group V elements other than N (nitride), those which further contain various elements added to control various physical properties such as conductivity type, and those which further contain various elements unintentionally contained therein.

The "stack" as used herein includes not only the stacking of layers in contact with one another but also the stacking of certain layers with other layers interposed between the certain layers. The "provision of an object on a layer" includes not only the provision of the object on and in direct contact with the layer but also the provision of the object on the certain layer with another layer interposed between the object and the certain layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first switching element comprising a heterojunction comprising a first compound semiconductor layer and a second compound semiconductor layer; and
   a driver which applies a voltage to a gate of the first switching element to control turn-on and turn-off of the first switching element; and
   a differentiator which differentiates a signal for controlling turn-on and turn-off of the first switching element,
   wherein the driver temporarily increases a gate voltage of the first switching element at a timing when the first switching element is turned on, during a period while the first switching element is on, and
   the driver uses an output result from the differentiator to generate the gate voltage.

2. The device of claim 1, wherein the driver applies a first voltage to the gate of the first switching element during a first period included in the period while the first switching element is on and including a timing for turn-on, and
   applies a second voltage lower than the first voltage to the gate of the switching element during a second period included in the period while the first switching element is on and following the first period.

3. The device of claim 1, wherein the first switching element is of a normally-on type.

4. The device of claim 1, wherein the first switching element is an HFET (Heterojunction Field Effect Transistor).

5. The device of claim 1, wherein the first and second compound semiconductor layers include nitride semiconductor layers.

6. The device of claim 1, wherein the driver compensates for a power loss when the first switching element turns on by temporarily increasing the gate voltage.

7. The device of claim 1, further comprising a second switching element,
   wherein a first terminal of the first switching element is connected to a first terminal of a power supply,
   a second terminal of the first switching element is connected to a first terminal of the second switching element, and
   a second terminal of the second switching element is connected to a second terminal of the power supply.

8. The device of claim 7, wherein the driver alternately turns on the first and second switching elements.

9. The device of claim 7, wherein the second switching element is of a normally-off type.

10. The device of claim 7, wherein the second switching element is an FET.

11. A semiconductor device comprising:
    a first switching element comprising a heterojunction comprising a first compound semiconductor layer and a second compound semiconductor layer; and
    a driver which applies a voltage to a gate of the first switching element to control turn-on and turn-off of the first switching element; and
    a differentiator which differentiates a signal for controlling turn-on and turn-off of the first switching element,
    wherein the driver temporarily reduces a gate voltage of the first switching element at a timing when the first switching element is turned off, during a period while the first switching element is off, and
    the driver uses an output result from the differentiator to generate the gate voltage.

12. The device of claim 11, wherein the driver applies a first voltage to the gate of the first switching element during a first period included in the period while the first switching element is off and including a timing for turn-off, and applies a second voltage higher than the first voltage to the gate of the switching element during a second period included in the period while the first switching element is off and following the first period.

13. The device of claim 11, wherein the first switching element is of a normally-on type.

14. The device of claim 11, wherein the first switching element is an HFET (Heterojunction Field Effect Transistor).

15. The device of claim 11, wherein the first and second compound semiconductor layers include nitride semiconductor layers.

16. The device of claim 11, wherein the driver compensates for a power loss when the first switching element turns off by temporarily reducing the gate voltage.

17. The device of claim 11, further comprising a second switching element, wherein a first terminal of the first switching element is connected to a first terminal of a power supply, a second terminal of the first switching element is connected to a first terminal of the second switching element, and a second terminal of the second switching element is connected to a second terminal of the power supply.

18. The device of claim 17, wherein the driver alternately turns on the first and second switching elements.

\* \* \* \* \*